United States Patent [19]

Williams

[11] 4,378,460
[45] Mar. 29, 1983

[54] METAL ELECTRODE FOR AMORPHOUS SILICON SOLAR CELLS

[75] Inventor: Richard Williams, Princeton, N.J.

[73] Assignee: RCA Corporation, New York, N.Y.

[21] Appl. No.: 297,767

[22] Filed: Aug. 31, 1981

[51] Int. Cl.$^3$ ............................................. H01L 31/06
[52] U.S. Cl. .................................... 136/256; 136/258; 357/30; 357/65
[58] Field of Search ...................... 136/256, 258 AM; 357/30, 65

[56] References Cited

U.S. PATENT DOCUMENTS 4,064,521 12/1977 Carlson ..................................... 357/2
4,226,897 10/1980 Coleman ................................. 427/39

OTHER PUBLICATIONS

C.R.C. Handbook of Chemistry & Physics, (1970-1971 Edition), pp. E-87, E-88.
A. G. Milnes et al., "Heterojunctions & Metal-Semiconductor Junctions", Academic Press (1972), p. 158.

Primary Examiner—Aaron Weisstuch
Attorney, Agent, or Firm—Birgit E. Morris; Donald S. Cohen

[57] ABSTRACT

An amorphous silicon solar cell having an N-type region wherein the contact to the N-type region is composed of a material having a work function of about 3.7 electron volts or less. Suitable materials include strontium, barium and magnesium and rare earth metals such as gadolinium and yttrium.

6 Claims, 4 Drawing Figures

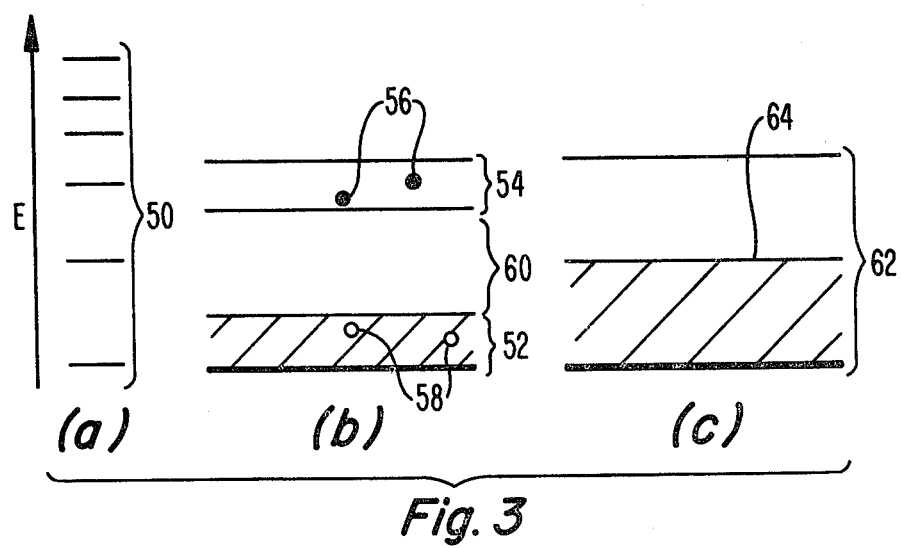
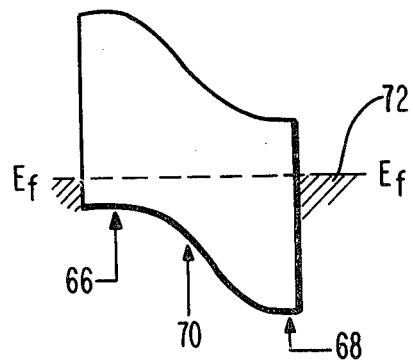
Fig. 3
Fig. 4

METAL ELECTRODE FOR AMORPHOUS SILICON SOLAR CELLS

The Government of the United States of America has rights in this invention pursuant to Department of Energy Contract No. EG-77-C-01-4042.

BACKGROUND OF THE INVENTION

The present invention relates to solar cells. In particular, the invention relates to the use of low work-function metals as electrodes for amorphous silicon solar cells.

Amorphous silicon solar cells have been described heretofore in a number of U.S. patents. In particular, such cells have been described in U.S. Pat. No. 4,064,521 entitled SEMICONDUCTOR DEVICE HAVING A BODY OF AMORPHOUS SILICON which issued to D. E. Carlson on Dec. 20, 1977; U.S. Pat. No. 4,126,150 entitled PHOTOVOLTAIC DEVICE HAVING INCREASED ABSORPTION EFFICIENCY which issued to A. E. Bell et al. on Nov. 21, 1978; and U.S. Pat. No. 4,217,148 entitled COMPENSATED AMORPHOUS SILICON SOLAR CELL which issued to D. E. Carlson on Aug. 12, 1980. Each of the aforementioned patents is incorporated herein by reference as background for the manner in which an amorphous silicon solar cell of the type described herein is made and used.

In amorphous silicon solar cells of the type heretofore described, an open circuit voltage of about 0.80 volts is typically observed under AM1 light conditions. It would be desirable to increase the value of the open circuit voltage of such solar cells, if that could be done without affecting either their short circuit current or their fill factors.

SUMMARY OF THE INVENTION

In accordance with the present invention a low work-function metal, such as yttrium or gadolinium, is used in place of the indium tin oxide (ITO) or metal contact to the N layer of the photocell. Such low work-function metals, or other rare earth metals, provide an optimum match to the energy bands of N type amorphous silicon.

BRIEF DESCRIPTION OF THE DRAWING

In the drawing

FIGS. 3, 3B, and 3C are energy band diagrams; and

FIG. 4 is an energy diagram.

DETAILED DESCRIPTION OF THE PREFERRED EMBODIMENTS

Figure 1:
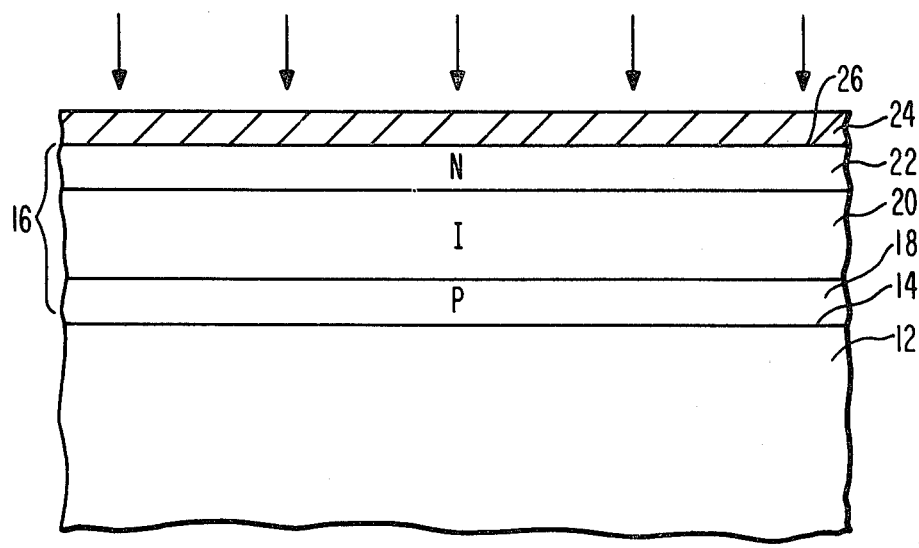
FIG. 1 is a cross-sectional view of a first embodiment of the present invention.

Referring to FIG. 1, an amorphous silicon solar cell 10 incorporating the present invention is shown. The solar cell 10 comprises a substrate 12 which may be comprised of a conductive material, such as stainless steel. On a surface 14 of the substrate 12 is a layer of amorphous silicon 16 which is comprised of a P type region 18, an N type region 22, and an I type region 20 therebetween.

A thin light conducting layer 24 of a low work-function metal is formed on a surface 26 of the N type region 22 whereby light (represented by the arrows) can be transmitted through the electrode 24 into the amorphous silicon layer 16. As is well known in the art, light incident on the intrinsic region 20 will generate hole-electron pairs therein such that an electric current will be generated between the conductive substrate 12 and the low work-function electrode 24 if they are connected together via an external circuit. As used herein, the term "low work-function" means a work-function of 3.7 eV or less, and preferably 3.2 eV or less.

In accordance with the present invention, the low work-function electrode 24 is preferably made of a rare earth metal, such as yttrium or gadolinium which have work-functions of about 3.2 eV. Other rare earth metals also have similar, low work-functions and could be used for the electrode 24 as could other low work-function metals, such as magnesium, strontium, or barium.

Figure 2:
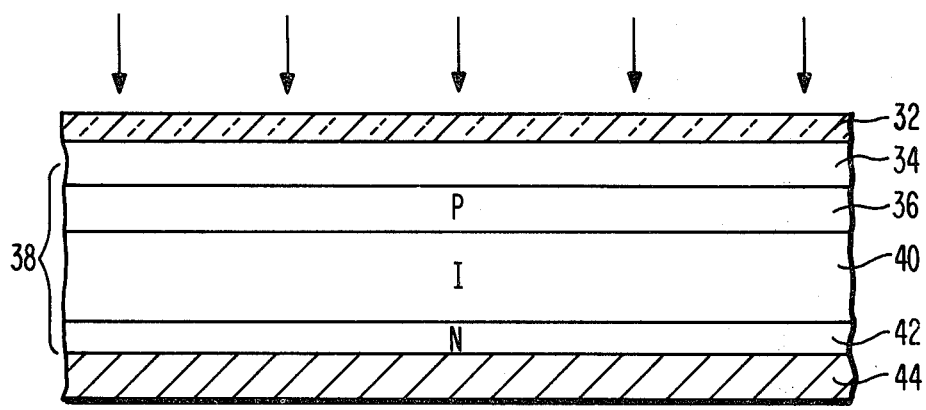
FIG. 2 is a cross-sectional view of a second embodiment of the present invention.

Referring now to FIG. 2, an alternative embodiment of a solar cell 30 is shown. In this embodiment 30, sometimes called a "superstrate" cell, light (indicated by the arrows) enters the cell 30 through a transparent superstrate 32 which is made of glass in this embodiment of the invention. A transparent conductive electrode 34, typically made of ITO, makes contact to a first region 36 of an amorphous silicon layer 38. The first region 36 is preferably a P type region which lies on one side of an I type region 40 which has, on its opposite side, an N type region 42. A low work-function electrode 44, comprised of a metal of the type described above, makes contact to the N type region 42 in this embodiment of the invention. In view of the fact that light is not transmitted through the electrode 44, it is not necessary for the electrode 44 to be transparent.

The reason for using low work-function electrodes of the type described herein relates to the better match between the work-function of such low work-function metals and the Fermi level present at the interface between the electrode and the N type amorphous silicon. Heretofore ITO, which has a relatively high work-function, e.g., about 5.0 eV, has typically been used as a transparent, conductive electrode for amorphous silicon solar cells. An examination of energy band diagrams suggests that the open circuit voltage of an amorphous silicon solar cell is higher when an ITO layer is present on the cell than when there is no electrode present. In particular, it has been observed that a solar cell having an open circuit voltage of 830 mV which was sputtered to remove material in order to obtain a graph of the open circuit voltage as a function of the thickness of the remaining material, a step change to 450 mV was observed upon the removal of the ITO layer. Thereafter, the open circuit voltage varied with the thickness of the material.

The advantage of using a low work-function metal as the contact material in amorphous silicon solar cells can be explained by referring to semiconductor energy band diagrams. In FIG. 3, the basic energy band diagram for a typical semiconductor, such as amorphous silicon, is shown. An isolated silicon atom has separate, discrete, well defined electronic energy states as shown in FIG. 3(a). These are represented by narrow horizontal lines 50 on a vertical scale of energy, E. When the atoms come together to form a solid, the interactions among the atoms cause the sharp energy levels of the isolated atoms to broaden into energy bands, as shown in FIG. 3(b). Ordinarily, only two of these bands, the valence band 52, and the conduction band 54, are important in the normal operation of a semiconductor device, such as a solar cell. Electrons 56 in the conduction band 54 and holes 58 in the valence band 52 are free to move and to carry an electric current. They are responsible for the useful properties of semiconductor devices. The holes 58 represent electrons that are missing from the valence band 52, having been excited to the higher energy levels of the conduction band 54 either by thermal energy or by the absorption of light. The energy gap 60 between valence and conduction bands 52, 54 represents a range of energies within which electrons or holes cannot exist, and corresponds to the forbidden energy levels in the isolated silicon atoms shown in FIG. 3(a). The shading in the valence band 52 indicates filled energy levels that contain electrons. The lack of shading of the conduction band 54 indicates that it is devoid of electrons except for the relatively small number excited by thermal energy or light. The characteristic properties of a semiconductor are that it has a valence band 52 nearly filled with electrons and a conduction band 54 nearly devoid of electrons, separated in energy by a forbidden gap 60. The energy band diagram for a typical metal is shown in FIG. 3(c). The characteristic of a metal is that it has a band 62, approximately half filled with electrons. The electrons occupy the lower energy states of the band 62, filling it from the bottom up to a level 64 known as the Fermi level. The relatively large number of electrons present explains the high conductivity of metals.

FIG. 4 shows the energy band diagram for a solar cell. By means of suitable dopant materials the conductivity of a semiconductor can be controlled to be P type, in which a majority of the thermally excited carriers are holes, or N type, in which the majority of the thermally excited carriers are electrons. The relative numbers of holes and electrons present are indicated by the Fermi level, $E_f$, which has the property that it will have a constant energy level throughout a material that is in thermal equilibrium. The typical device has a thin P type region 66 and a thin N type region 68 separated by a relatively thick I type region 70 which has properties intermediate between those of the P and N type regions 66, 68. The result is a structure that has a built-in electric field at equilibrium. It is this built-in electric field that allows electric power to be generated when holes and electrons are excited in the I type layer 70 by light. We are specifically interested in the properties of the metal contact 72. The energy band relations between the metal contact 72 and the semiconductor depend on the chemical nature of the materials involved. By using different metals, one might have the relationship as drawn; or the Fermi level of the metal might be higher, near the energy of the semiconductor conduction band; or lower, near the middle of the forbidden energy gap; or even lower than that. To achieve the highest open-circuit voltage, and, therefore, the highest solar cell efficiency, the inventor believes that the Fermi level of the metal should make contact as near as possible to the semiconductor conduction band on the energy scale. In this way, one would maximize the built-in electric field in the device and achieve the highest potential efficiency.

Recent experiments have shown that known contact materials, such as indium-tin oxide make contact to the semiconductor approximately as drawn in FIG. 4. The Fermi level of the contact material is roughly half way between the semiconductor conduction band and the center of the forbidden gap. This leads to a loss in potential open circuit voltage of about 0.4 volt. In thinking about other materials that might make superior contacts, one typically makes use of the work-function, W, an experimentally determined quantity which is known for many different metals. The work-function determines the Fermi level, $E_f$, for the material relative to a fixed reference known as the vacuum level. The inventor believes that a material having $E_f$ higher on the energy scale of FIG. 4 would be most desirable. This corresponds to a material with a low work-function, such as those discussed above. The currently favored contact material, indium-tin oxide, has a relatively high work-function. Accordingly, the inventor believes that there are materials available which would be preferable to ITO.

The inventor has therefore concluded that the open circuit voltage was higher when the ITO layer was present, because the ITO raises the Fermi level in the amorphous silicon at the interface. Experimental results in which yttrium and gadolinium were used as electrodes indicated that they provide more optimal contacts to amorphous silicon than does ITO. It is hypothesized that open circuit voltage on the order of 1.05 volts can be achieved using metals having work-functions of about 3.1 eV. Experimental results in which a platinum (high work-function) electrode was compared to yttrium and gadolinium (low work-function) electrodes on the same body of amorphous silicon appear to corroborate the theoretical expectation.

I claim:
1. A solar cell comprising:
    (a) a body of amorphous silicon;
    (b) a P type region and an N type region in said body of amorphous silicon, said P type region being separated from said N type region by an intrinsic region; and
    (c) means for contacting said N type region comprising a metal having a work function less than about 3.7 electron-volts.
2. The solar cell of claim 1 wherein the metal has a work-function of less than 3.2 electron-volts.
3. The solar cell of claim 2 wherein the metal is selected from the group consisting of barium and strontium.
4. The solar cell of claim 1 wherein said metal is a rare earth metal.
5. The solar cell of claim 4 wherein the rare earth metal is selected from the group consisting of gadolinium and yttrium.
6. The solar cell of claim 1 wherein said metal is magnesium.

* * * * *